United States Patent
Herrmann et al.

(10) Patent No.: US 8,872,330 B2
(45) Date of Patent: Oct. 28, 2014

(54) THIN-FILM SEMICONDUCTOR COMPONENT AND COMPONENT ASSEMBLY

(75) Inventors: Siegfried Herrmann, Neukirchen (DE); Berthold Hahn, Hemau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 92 days.

(21) Appl. No.: 12/376,425

(22) PCT Filed: Jul. 16, 2007

(86) PCT No.: PCT/DE2007/001273
§ 371 (c)(1),
(2), (4) Date: Jul. 10, 2009

(87) PCT Pub. No.: WO2008/014750
PCT Pub. Date: Feb. 7, 2008

(65) Prior Publication Data
US 2010/0163915 A1 Jul. 1, 2010

(30) Foreign Application Priority Data

Aug. 4, 2006 (DE) .......................... 10 2006 036 543
Jan. 29, 2007 (DE) .......................... 10 2007 004 303

(51) Int. Cl.
*H01L 23/367* (2006.01)
*H01L 33/64* (2010.01)
(Continued)

(52) U.S. Cl.
CPC .............. *H01L 33/0079* (2013.01); *H01L 33/62* (2013.01); *H04L 33/54* (2013.01); *H01L 33/647* (2013.01); *H01L 27/15* (2013.01); *H01L 33/642* (2013.01); *H01L 2224/48091* (2013.01); *H01L 33/385* (2013.01)

USPC .............. 257/707; 257/81; 257/82; 257/706; 257/796; 257/E33.056; 257/E33.057; 257/E33.058; 257/E33.075; 257/E23.101; 438/26; 438/122; 438/125; 438/126; 362/249.02; 362/311.02; 362/373

(58) Field of Classification Search
CPC .......................... H01L 33/642; H01L 33/647
USPC ........ 257/99, E33.075, 81, 82, 706, 707, 796, 257/E33.056, E33.057, E33.058, E33.068, 257/E23.101; 438/26, 122, 125, 126; 362/249.02, 311.02, 373
See application file for complete search history.

(56) References Cited

U.S. PATENT DOCUMENTS

| | | |
|---|---|---|
| 4,068,572 A | 1/1978 | Vogt |
| 4,894,751 A | 1/1990 | Wehnelt |

(Continued)

FOREIGN PATENT DOCUMENTS

| | | |
|---|---|---|
| CN | 1271182 | 10/2000 |
| CN | 1317154 | 10/2001 |

(Continued)

OTHER PUBLICATIONS

Data Sheet TechFilm BOLGER C-14 F, Polytec PT, Version 1, Jun. 2002 (pp. 2).

(Continued)

*Primary Examiner* — Kimberly Rizkallah
*Assistant Examiner* — Maria Ligai
(74) *Attorney, Agent, or Firm* — Cozen O'Connor

(57) ABSTRACT

A thin-film semiconductor component having a carrier layer and a layer stack which is arranged on the carrier layer, the layer stack containing a semiconductor material and being provided for emitting radiation, wherein a heat dissipating layer provided for cooling the semiconductor component is applied on the carrier layer. A component assembly is also disclosed.

17 Claims, 5 Drawing Sheets

(51) Int. Cl.
*H01L 33/00* (2010.01)
*H01L 33/62* (2010.01)
*H01L 27/15* (2006.01)
*H01L 33/38* (2010.01)

(56) References Cited

U.S. PATENT DOCUMENTS

| | | | |
|---|---|---|---|
| 5,040,044 A | 8/1991 | Noguchi et al. | |
| 5,779,924 A | 7/1998 | Krames et al. | |
| 5,833,073 A | 11/1998 | Schatz et al. | |
| 6,071,795 A | 6/2000 | Cheung et al. | |
| 6,372,608 B1 | 4/2002 | Shimoda et al. | |
| 6,441,403 B1 | 8/2002 | Chang et al. | |
| 6,559,075 B1 | 5/2003 | Kelly et al. | |
| 6,562,648 B1 | 5/2003 | Wong et al. | |
| 6,770,936 B2 | 8/2004 | Inoue et al. | |
| 6,876,003 B1 | 4/2005 | Nakamura et al. | |
| 6,878,563 B2 | 4/2005 | Bader et al. | |
| 6,888,237 B1 | 5/2005 | Guenther | |
| 6,906,346 B2 | 6/2005 | Nishitani et al. | |
| 6,956,241 B2 | 10/2005 | Sugawara et al. | |
| 6,956,246 B1 | 10/2005 | Epler et al. | |
| 7,078,737 B2 | 7/2006 | Yuri et al. | |
| 7,265,392 B2 | 9/2007 | Hahn et al. | |
| 7,528,077 B2 | 5/2009 | Izuno et al. | |
| 2002/0043929 A1* | 4/2002 | Tazawa | 313/506 |
| 2002/0115265 A1 | 8/2002 | Iwafuchi et al. | |
| 2003/0075723 A1 | 4/2003 | Heremans et al. | |
| 2003/0153108 A1* | 8/2003 | Durocher et al. | 438/26 |
| 2003/0178627 A1 | 9/2003 | Marchl et al. | |
| 2003/0189829 A1* | 10/2003 | Shimizu et al. | 362/240 |
| 2003/0217805 A1 | 11/2003 | Takayama et al. | |
| 2004/0033638 A1 | 2/2004 | Bader et al. | |
| 2004/0047151 A1 | 3/2004 | Bogner et al. | |
| 2004/0048447 A1 | 3/2004 | Kondo | |
| 2004/0053449 A1 | 3/2004 | Chang et al. | |
| 2004/0099873 A1 | 5/2004 | Illek | |
| 2004/0099926 A1 | 5/2004 | Yamazaki et al. | |
| 2004/0110316 A1 | 6/2004 | Ogihara et al. | |
| 2004/0113167 A1 | 6/2004 | Bader | |
| 2004/0149810 A1 | 8/2004 | Yang et al. | |
| 2004/0211968 A1 | 10/2004 | Lin et al. | |
| 2005/0033638 A1 | 2/2005 | Donnet | |
| 2005/0105878 A1 | 5/2005 | Wu | |
| 2005/0110033 A1 | 5/2005 | Herehmans et al. | |
| 2005/0116235 A1 | 6/2005 | Schultz et al. | |
| 2005/0148106 A1 | 7/2005 | Iwafuchi et al. | |
| 2005/0151147 A1* | 7/2005 | Izuno et al. | 257/98 |
| 2005/0199891 A1 | 9/2005 | Kunisato et al. | |
| 2005/0207165 A1 | 9/2005 | Shimizu et al. | |
| 2005/0212007 A1 | 9/2005 | Daniels et al. | |
| 2005/0212098 A1 | 9/2005 | Bogner et al. | |
| 2005/0239270 A1 | 10/2005 | Fehrer et al. | |
| 2005/0274971 A1 | 12/2005 | Wang et al. | |
| 2006/0011923 A1 | 1/2006 | Eisert et al. | |
| 2006/0011925 A1 | 1/2006 | Bader et al. | |
| 2006/0043384 A1 | 3/2006 | Cho et al. | |
| 2006/0049423 A1 | 3/2006 | Yamaguchi et al. | |
| 2006/0051937 A1* | 3/2006 | Ploessl et al. | 438/459 |
| 2006/0056474 A1 | 3/2006 | Fujimoto et al. | |
| 2006/0065905 A1 | 3/2006 | Eisert et al. | |
| 2006/0091409 A1* | 5/2006 | Epler et al. | 257/95 |
| 2006/0097354 A1 | 5/2006 | Ogihara et al. | |
| 2006/0145170 A1 | 7/2006 | Cho | |
| 2006/0163595 A1 | 7/2006 | Hsieh et al. | |
| 2006/0175625 A1 | 8/2006 | Yokotani et al. | |
| 2006/0237735 A1 | 10/2006 | Naulin et al. | |
| 2007/0010067 A1 | 1/2007 | Shimoda et al. | |
| 2007/0190290 A1 | 8/2007 | Gunther et al. | |
| 2007/0207165 A1 | 9/2007 | Thiry et al. | |
| 2007/0242462 A1* | 10/2007 | Van Laanen et al. | 362/294 |
| 2008/0128731 A1 | 6/2008 | DenBaars et al. | |
| 2008/0225523 A1* | 9/2008 | De Samber et al. | 362/249 |
| 2009/0127573 A1 | 5/2009 | Guenther et al. | |
| 2009/0166645 A1 | 7/2009 | Lee | |

FOREIGN PATENT DOCUMENTS

| | | |
|---|---|---|
| CN | 1656620 | 8/2005 |
| DE | 100 17 336 | 10/2001 |
| DE | 100 20 464 | 11/2001 |
| DE | 100 40 448 | 3/2002 |
| DE | 10 051 465 | 5/2002 |
| DE | 103 03 977 | 11/2003 |
| DE | 102 34 978 | 2/2004 |
| DE | 202 20 258 | 2/2004 |
| DE | 102 45 628 | 4/2004 |
| DE | 102 45 631 | 4/2004 |
| DE | 103 39 985 | 3/2005 |
| DE | 103 53 679 | 6/2005 |
| DE | 10 2005 013 894 | 1/2006 |
| DE | 10 2004 036 962 | 3/2006 |
| DE | 10 2004 050 371 | 4/2006 |
| DE | 10 2005 055 293 | 2/2007 |
| DE | 100 41 328 | 3/2007 |
| DE | 10 2007 004 301 | 2/2008 |
| DE | 10 2007 004 303 | 2/2008 |
| DE | 10 2007 004 304 | 7/2008 |
| EP | 0 404 565 | 12/1990 |
| EP | 0 977 277 | 2/2000 |
| EP | 1 351 308 | 10/2003 |
| EP | 1 416 219 | 5/2004 |
| EP | 1 525 619 | 4/2005 |
| EP | 1 653 523 | 5/2006 |
| EP | 1 657 739 | 5/2006 |
| EP | 1 692 722 | 8/2006 |
| EP | 1 774 599 | 4/2007 |
| EP | 1 905 103 | 4/2008 |
| GB | 2 311 413 | 9/1997 |
| JP | 9-92878 | 4/1997 |
| JP | 10-200163 | 7/1998 |
| JP | 11-97518 | 4/1999 |
| JP | 2000-49382 | 2/2000 |
| JP | 2000-106454 | 4/2000 |
| JP | 2001-168344 | 6/2001 |
| JP | 2002-076523 | 3/2002 |
| JP | 2002-143797 | 5/2002 |
| JP | 2002-185039 | 6/2002 |
| JP | 2002-339952 | 11/2002 |
| JP | 2003-510853 | 3/2003 |
| JP | 2003-124528 | 4/2003 |
| JP | 2003-131137 | 5/2003 |
| JP | 2003-137073 | 5/2003 |
| JP | 2003-347524 | 12/2003 |
| JP | 2004-47691 | 2/2004 |
| JP | 2004-047691 | 2/2004 |
| JP | 2004-047975 | 2/2004 |
| JP | 2004-507094 | 3/2004 |
| JP | 2004-111905 | 4/2004 |
| JP | 2004-186685 | 7/2004 |
| JP | 2004-528349 | 9/2004 |
| JP | 2005-183777 | 7/2005 |
| JP | 2005-235778 | 9/2005 |
| JP | 2005-535144 | 11/2005 |
| JP | 2006-128512 | 5/2006 |
| JP | 2006-147787 | 6/2006 |
| JP | 2006-147889 | 6/2006 |
| JP | 2007-073968 | 3/2007 |
| JP | 2007-513520 | 5/2007 |
| JP | 2008-028352 | 2/2008 |
| JP | 2008-508699 | 3/2008 |
| JP | 2008-545267 | 12/2008 |
| JP | 2009-525614 | 7/2009 |
| JP | 2009-530832 | 8/2009 |
| KR | 100 599 012 | 7/2006 |
| TW | 416150 | 12/2000 |
| TW | 515103 | 12/2002 |
| TW | 091120976 | 8/2009 |
| WO | WO 98/14986 | 4/1998 |
| WO | WO 00/69000 | 11/2000 |
| WO | WO 01/24280 | 4/2001 |
| WO | WO 03/016782 | 2/2003 |
| WO | WO 2004/017407 | 2/2004 |
| WO | WO 2004/068572 | 8/2004 |
| WO | WO 2005/062382 | 7/2005 |

(56) References Cited

FOREIGN PATENT DOCUMENTS

| WO | WO 2005/099310 | 10/2005 |
|---|---|---|
| WO | WO 2005/100016 | 10/2005 |
| WO | WO 2006/012838 | 2/2006 |
| WO | WO 2006/034671 | 4/2006 |
| WO | WO 2006/052330 | 5/2006 |
| WO | WO 2007/001124 | 1/2007 |
| WO | WO 2007/016908 | 2/2007 |
| WO | WO 2008/014750 | 2/2008 |
| WO | WO 2008/092774 | 8/2008 |

OTHER PUBLICATIONS

3M Grounded Heat Sink Bonding Film, 7373, pp. 1-4.

"Curtain Coating", P2005,0612 (pp. 2).

$M^3D$™ and Maskless Mesoscale™ Materials Deposition, OPTOMEC (pp. 2).

Preliminary Report on Patentability (with English translation) dated Mar. 12, 2008 issued for the underlying International PCT Application No. PCT/DE2006/001367.

Schnitzer I. et al.: "30% External quantum efficiency from surface textured, thin-film light-emitting diodes" Appl. Phys. Lett. vol. 63 No. 16, Oct. 18, 1993, pp. 2174-2176.

Office Action issued on Apr. 20, 2011 for corresponding U.S. Appl. No. 12/525,066 (US 2010/0072500).

Office Action for U.S. Appl. No. 12/525,066 dated Sep. 7, 2011.

\* cited by examiner

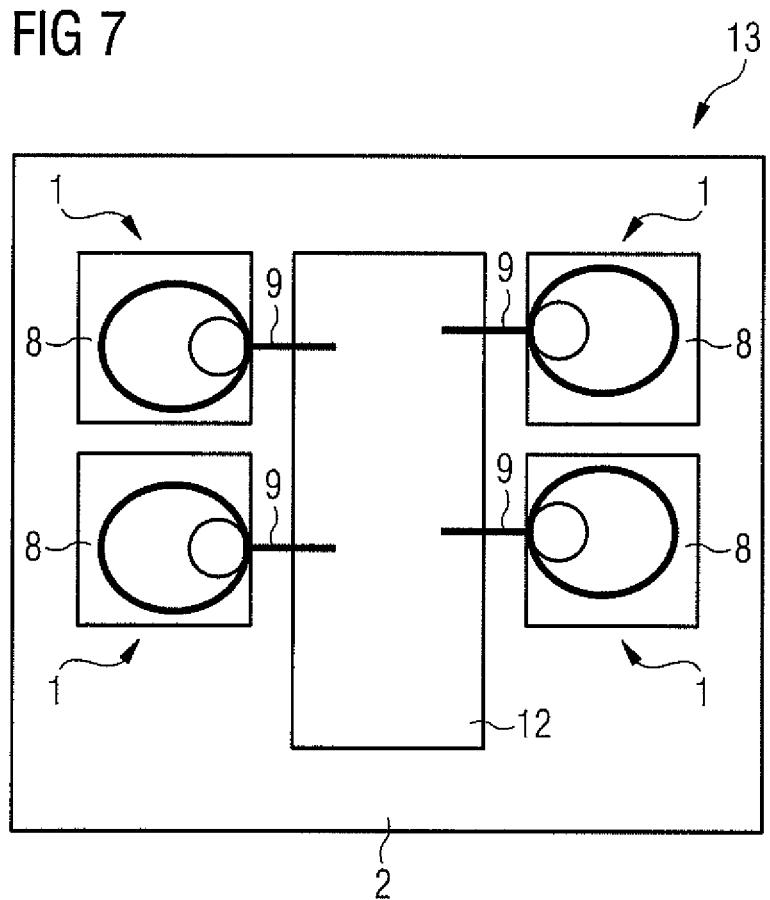

THIN-FILM SEMICONDUCTOR COMPONENT AND COMPONENT ASSEMBLY

RELATED APPLICATIONS

This is a U.S. national stage under 35 USC §371 of application No. PCT/DE2007/001273, filed on Jul. 16, 2007.

This application claims the priority of German Patent Application Nos. 10 2006 036 543.7 filed Aug. 4, 2006 and 10 2007 004 303.3 filed Jan. 29, 2007, the entire content of both of which is hereby incorporated by reference.

FIELD OF THE INVENTION

The invention relates to a thin-film semiconductor component and a component assembly.

BACKGROUND OF THE INVENTION

The published patent application DE 100 40 448 A1 describes a semiconductor chip and a method for producing semiconductor chips using thin-film technology. A layer compound comprising an active layer sequence and a base layer is arranged on a substrate. Furthermore, a reinforcing layer and an auxiliary carrier layer are added to the layer compound, said reinforcing layer and auxiliary carrier layer being applied to the base layer electrolytically before the substrate is stripped away. On the side of the stripped-away substrate, a film is laminated on for handling the semiconductor chips formed from the layer compound.

Furthermore, the published patent application DE 102 34 978 A1 discloses a surface-mountable semiconductor component having a semiconductor chip and two external connections, wherein the external connections are fitted to a film.

SUMMARY OF THE INVENTION

It is an object of the present invention to specify a thin-film semiconductor component which is comparatively operationally stable in conjunction with a small structural height. It is furthermore an object of the present invention to specify a component assembly having a small structural height in conjunction with operational stability.

A thin-film semiconductor component according to an embodiment of the invention comprises a carrier layer and a layer stack which is arranged on the carrier layer, the layer stack containing a semiconductor material and being provided for emitting radiation, wherein a heat dissipating layer provided for cooling the semiconductor component is applied on the carrier layer.

The heat dissipating layer is provided for absorbing the heat that arises during operation of the thin-film semiconductor component and for dissipating it from the layer stack or component. The heat dissipating layer preferably contains a material having a comparatively high thermal conductivity. This has the advantage that it is possible to counteract a decrease in the luminous efficiency caused by the heat that arises during operation of the component and by an associated increase in temperature. Furthermore, it is thereby possible to reduce the risk of the generated radiation being subjected to a wavelength shift occurring in the event of a temperature increase. The heat transfer between the layer stack and the heat dissipating layer can be effected by thermal conduction and/or thermal radiation.

The thin-film semiconductor component is distinguished in particular by at least one of the following characteristic features:

a reflective layer is preferably applied or formed at a first main area—facing toward a carrier element of a radiation-generating epitaxial layer sequence, said reflective layer reflecting at least part of the electromagnetic radiation generated in the epitaxial layer sequence back into the latter;

the epitaxial layer sequence has a thickness in the region of 20 μm or less, in particular in the region of 10 μm; and the epitaxial layer sequence contains at least one semiconductor layer having at least one area having an intermixing structure which ideally leads to an approximately ergodic distribution of the light in the epitaxial layer sequence, that is to say that it has an as far as possible ergodically stochastic scattering behavior.

A basic principle of a radiation-emitting thin-film semiconductor chip is described for example in I. Schnitzer et al., Appl. Phys. Lett. 63 (16), 18 Oct. 1993, 2174-2176, the disclosure content of which in this respect is hereby incorporated by reference.

In accordance with one preferred embodiment, the heat dissipating layer is arranged on a side of the carrier layer that faces the layer stack. In particular, the heat dissipating layer can be fixed on the carrier layer.

In accordance with an embodiment to which further preference is given, the heat dissipating layer is arranged between the layer stack and the carrier layer. Advantageously, the layer stack can be mounted on the heat dissipating layer—serving as a cooling element—and be thermally conductively connected thereto, wherein the heat dissipating layer is integrated on or in the carrier layer.

The heat dissipating layer can be offset with respect to the layer stack.

In one particular configuration, the heat dissipating layer is embodied in sheetlike fashion. This means that the lateral dimensions of the heat dissipating layer are greater than its height. In particular, the heat dissipating layer has a base area which is at least equal in size to the base area of the layer stack. In this case, the base area of the heat dissipating layer does not necessarily have a rectangular shape, but rather can for example also be embodied in scale-like fashion, such that in particular two side edges bounding the base area run in curved fashion. Furthermore, the heat dissipating layer is preferably embodied as a closed area. This is also advantageous with regard to making electrical contact with the thin-film semiconductor component, since, in the case of an electrically conductive heat dissipating layer, through this it is possible for current to be impressed homogeneously into the layer stack. Preferably, the heat dissipating layer contains an electrically conductive material. In particular, the heat dissipating layer can serve as an electrical contact in this case.

Particularly preferably, the heat dissipating layer is a metal coating applied to the carrier layer. By way of example, the heat dissipating layer can contain Cu, Ni or Ag.

As an alternative, the heat dissipating layer can contain an electrically insulating material, for example a ceramic material.

Silicon is also a suitable material for the heat dissipating layer.

Preferably, the thickness of the heat dissipating layer lies within the one- and two-digit micrometers range. In particular, the thickness can be 5 μm to 30 μm.

The thickness of the heat dissipating layer is advantageously dimensioned in such a way that, on the one hand, it is thin enough so as not to significantly increase the structural height of the component and, on the other hand, it is thick enough to bring about a relatively good cooling of the component.

In accordance with a further variant, the carrier layer is a film. In particular, the carrier layer can be a plastic sheet produced in webs. A sufficient stability can be achieved despite a relatively small thickness of the carrier layer. This is because the carrier layer is elastic on account of the relatively small thickness, whereby the risk of crack formations is reduced. In the context of the invention, a relatively small thickness should be understood as preferably 100 µm, particularly preferably less than 100 µm.

Preferably, the carrier layer contains a plastic material. By way of example, an epoxy resin, PET (polyethylene terephthalate) or a polymer, in particular a polyimide, is suitable as plastic material.

Particularly preferably, the carrier layer is transparent to the radiation emitted by the layer stack. With further preference, the heat dissipating layer is offset with respect to the layer stack. As a result, the radiation can couple out through the carrier layer without being reflected by the heat dissipating layer. By means of a transparent carrier layer and covering layer, which is described in more detail below, the thin-film semiconductor component can advantageously be emissive on both sides.

Furthermore, the carrier layer can be electrically conductive or insulating depending on the application.

In accordance with one advantageous variant, the carrier layer is arranged on a support. By way of example, the support can be a metal film. Such a support enables the heat transport from the component to be improved further. In particular, the carrier layer, which is preferably a plastic film in this variant, is mechanically and thermally connected to the support by means of a thermally conductive paste. In this variant, the carrier layer can have an opening with a throughplating, such that a first electrical connection of the layer stack is effected by means of the support and a second electrical connection is effected by means of the heat dissipating layer applied on the carrier layer.

In accordance with a further variant, the carrier layer can have a first partial layer and a second partial layer. Preferably, the first partial layer is applied to the second partial layer and furthermore has a small layer thickness. The layer thickness is dimensioned in particular according to the desired heat flow which is intended to flow through the first partial layer and be as large as possible. The heat flow is antiproportional to the layer thickness. The second partial layer can be a film, in particular a metal film, which is coated with a thin plastic layer, the first partial layer. Advantageously, the first partial layer counteracts an expansion of the second partial layer in the event of heating.

The layer stack can be adhesively bonded or bonded onto the heat dissipating layer.

In one possible variant for producing the semiconductor component according to the invention, the following steps are furthermore carried out:
forming a layer stack containing a semiconductor material on a growth substrate,
applying the carrier layer to the layer stack,
stripping away the growth substrate.

Therefore, the carrier layer is applied on that side of the layer compound which is remote from the growth substrate, said carrier layer adhering to the layer stack after bonding onto the carrier layer.

It is also conceivable for the growth substrate to be stripped away without the carrier layer previously being applied to the layer stack.

In a further configuration of the component, a covering layer for covering the layer stack is arranged on a side of the layer stack opposite to the carrier layer. Said covering layer can advantageously replace a potting. In particular, the covering layer is suitable for effectively preventing the penetration of moisture.

In accordance with a first variant, the covering layer is applied to the layer stack by means of a coating method, for example by means of the curtain casting method. The curtain casting method advantageously permits a uniform covering layer even on uneven surfaces.

In accordance with a second variant, the covering layer is a film.

By way of example, the covering layer can be applied as a flexible covering layer on that side of the layer stack which is remote from the carrier layer, and can then be cured. As an alternative, the flexible covering layer can be left in an incompletely cured state.

A further possibility consists in applying a covering layer which has a base layer and an adhesion layer facing the layer compound, wherein the adhesion layer adheres on the layer compound.

Preferably, the covering layer contains a transparent material. The covering layer can serve as a coupling-out layer.

Particularly preferably, the covering layer contains glass or plastic.

With further preference, the covering layer has a converter material for converting the radiation emitted by the layer stack. The converter material is suitable for converting at least one portion of the radiation emitted by the layer stack toward higher wavelengths. In this way, particularly with a layer stack that emits ultraviolet or blue radiation, white light can be generated by wavelength conversion of part of the emitted radiation into the complementary spectral range, for example the yellow spectral range. Such a configuration advantageously enables a cost-effective panel mounting for white thin-film semiconductor components.

A layer stack that emits ultraviolet or blue radiation comprises, in particular, a material based on nitride compound semiconductors. In the present connection, "based on nitride compound semiconductors" means that the active epitaxial layer sequence or at least one layer thereof comprises a nitride III/V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can have one or more dopants and additional constituents which essentially do not change the characteristic physical properties of the $Al_nGa_mIn_{1-n-m}N$ material. For the sake of simplicity, however, the above formula only comprises the essential constituents of the crystal lattice (Al, Ga, In, N), even if these can be replaced in part by small quantities of further substances.

In one particular embodiment, the covering layer has an optical structure. The latter can be formed for example in lens-, prism- or pyramid-shaped fashion, whereby it is possible, inter alia, to focus the radiation or improve the coupling-out of radiation. Furthermore, the covering layer can be partly reflectively coated. In particular, the covering layer has a reflective coating which, in combination with the heat dissipating layer which lies opposite the covering layer and which is then reflective, in particular, enables a relatively homogeneous radiation distribution in the component, such that a comparatively uniformly luminous area can be realized.

The optical structure can be arranged on a side of the covering layer that faces or is remote from the layer stack.

An arrangement of the carrier layer and of the covering layer on two sides can advantageously replace a housing body.

Furthermore, it is conceivable for the covering layer alone to suffice to ensure the mechanical stability of the thin-film semiconductor component. In this case, the carrier layer can be completely removed at the end of the production process. The heat dissipating layer can then serve as a mounting area. Furthermore, it is possible to partly remove the carrier layer. If the carrier layer is electrically conductive, then it may be expedient to remove the carrier layer in the region between the heat dissipating layer and a contact pad in order to avoid a short circuit during operation of the thin-film semiconductor component.

While a first electrical connection region is preferably provided on a side of the layer stack that faces the carrier layer, the layer stack can have a second electrical connection region on a coupling-out side remote from the carrier layer. For making contact with the layer stack on the radiation coupling-out side, at least one conductor track preferably runs along a surface of the covering layer which faces the layer stack. By way of example, the conductor track can run along the covering layer. Preferably, the conductor track is applied on the covering layer. In particular, the conductor track can extend partly on the layer stack and partly on the carrier layer, with a passivation layer being arranged between the conductor track and the layer stack. The conductor track can be electrically conductively connected to the second electrical connection region.

Furthermore, the conductor track can be embodied in self-supporting fashion. In this case, the conductor track is preferably connected to a contact pad arranged on the carrier layer and bears in particular on the passivation layer. The contact pad particularly preferably has a height corresponding to the layer stack, such that the conductor track runs substantially parallel to the radiation coupling-out area and contact can easily be made with an electrical connection region arranged thereon. Advantageous dimensions of the conductor track are of the order of magnitude of 10 μm×50 μm. The dimensions can also be larger in high-current applications.

A wire-free contact-making on the coupling-out side is preferred in the context of the invention. This has a positive effect on the structural height of the thin-film semiconductor component since the conductor track is flatter in comparison with a bonding wire. Moreover, a wire-free contact-making is advantageous with regard to a wavelength conversion that takes place in the covering layer.

In one preferred variant, the second electrical connection region is embodied as a contact structure having a bonding pad and contact webs. The bonding pad is preferably arranged in an edge region of the radiation exit area, such that radiation emerging from the layer stack in the central region of the radiation exit area is advantageously not absorbed in the bonding pad. The arrangement of the bonding pad in an edge region of the radiation exit area should be understood to mean, in particular, that the mid point of the bonding pad is at a smaller distance from at least one side flank of the layer stack than from the mid point of the radiation exit area. Advantageously, by virtue of the arrangement of the bonding pad in an edge region of the radiation exit area, in contrast to a chip with a bonding pad arranged centrally on the radiation exit area, it is not necessary to lead a conductor track across the radiation exit area to the bonding pad, whereby an absorption of the emitted radiation would occur. In particular, a plurality of contact webs which are electrically conductively connected to the bonding pad are arranged on the radiation exit area, said contact webs resulting in a comparatively homogeneous current distribution in the layer stack despite the bonding pad arranged in an edge region of the radiation exit area.

Preferably, the thin-film semiconductor component is comparatively flexible.

A component assembly according to the invention has at least two thin-film semiconductor components in accordance with at least one of the configurations mentioned above. Since the thin-film semiconductor components are comparatively flexible, it is possible in the case of a sheetlike arrangement of the thin-film semiconductor components, by means of the component assembly, to realize any predetermined curved luminous areas and hence various luminous figures. It is conceivable, inter alia, to bend the sheetlike component assembly in tubular fashion, such that a luminous cylinder arises.

In accordance with one preferred variant, the thin-film semiconductor components have a common carrier layer. The carrier layer is embodied in particular in accordance with one of the variants mentioned above.

In accordance with a variant to which further preference is given, a contact pad for an electrical contact of the layer stacks on the coupling-out side is applied on the carrier layer between the layer stacks.

The thin-film semiconductor components can be electrically connected in various ways. In one preferred configuration, the thin-film semiconductor components are connected in series. Particularly preferably, in this case the second connection region of a first thin-film semiconductor component is electrically connected, for example by means of a bonding wire, to the heat dissipating layer of a second thin-film semiconductor component, wherein the heat dissipating layer serves as an electrical contact.

As an alternative, the first and the second connection region can be arranged on a side of the layer stack that faces the carrier layer, wherein the first connection region is electrically connected to a first heat dissipating layer serving as an electrical contact and the second connection region is electrically connected to a second heat dissipating layer serving as an electrical contact.

A component assembly according to the invention is suitable in particular for backlighting, for example of LCD displays. Advantageously, the size of the component assembly, that is to say the number of thin-film semiconductor components, can easily be varied since no major difficulties are posed by severing on account of the flexible carrier layer and hence division into smaller component assemblies.

BRIEF DESCRIPTION OF THE DRAWINGS

Further features and advantageous configurations of the thin-film semiconductor component and of the component assembly will become apparent from the exemplary embodiments explained in more detail below in conjunction with FIGS. 1 to 7.

In the figures:

FIG. 7 shows a schematic plan view of a first exemplary embodiment of a component assembly according to the invention.

DETAILED DESCRIPTION OF THE DRAWINGS

In the exemplary embodiments, identical or identically acting constituent parts are in each case provided with the same reference symbols. The illustrated constituent parts in the figures, in particular the sizes of layer thicknesses illustrated, should not be regarded as true to scale, in principle. Rather, they may be illustrated in part with an exaggerated size in order to afford a better understanding.

Figure 1:
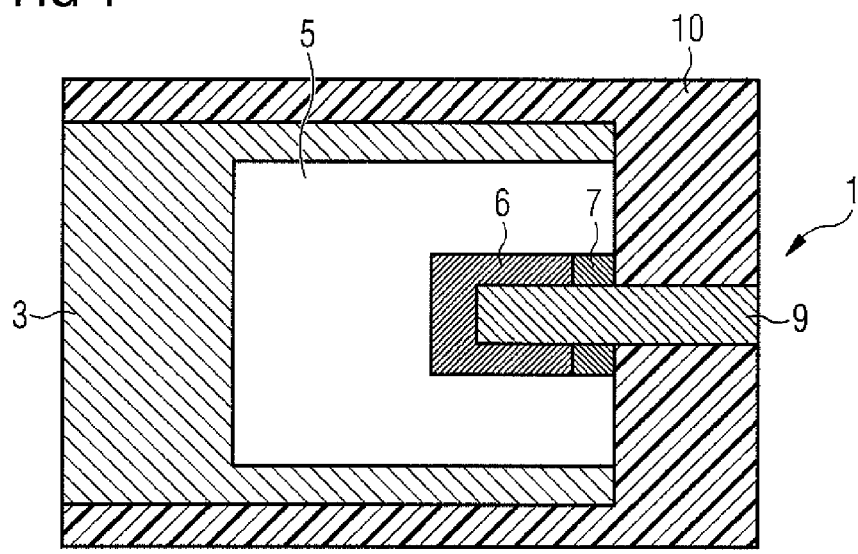
FIG. 1 shows a schematic plan view of a first exemplary embodiment of a thin-film semiconductor component according to the invention.

The thin-film semiconductor component 1 illustrated in FIG. 1 has a covering layer 10. The latter can protect a layer stack 8 (see FIG. 2) against damaging moisture. In particular, the covering layer 10 is transmissive to the radiation generated by a semiconductor layer sequence 5 of the layer stack 8 (see FIG. 2). In this case, the covering layer 10 simultaneously serves as a coupling-out layer. The covering layer 10 can have an optical structure for changing the emission characteristic of the thin-film semiconductor component 1, said optical structure being embodied for example in lens-, prism- or pyramid-shaped fashion. Furthermore, the covering layer 10 can be partly reflectively coated.

Furthermore, the covering layer 10 is suitable as electrical insulation between a heat dissipating layer 3 and a conductor track 9. This is because the heat dissipating layer 3 can have electrical conductivity alongside the thermal conductivity. In order furthermore to prevent a short circuit between semiconductor layers of a different conductivity type in the semiconductor layer sequence 5, a passivation layer 7 is arranged between the conductor track 9 and the semiconductor layer sequence 5. Said passivation layer contains silicon oxide, for example.

The layer sequence 5 is essentially provided for generating radiation. The layer sequence 5 can have a conventional pn junction, a double heterostructure, a single quantum well structure or a multiple quantum well structure. In particular, the layer sequence 5 is substrateless, which means that a growth substrate used for growing the layer sequence 5 is no longer present in the finished thin-film semiconductor component 1.

As electrical contacts, the layer stack 8 (see FIG. 2) comprises a first electrical connection region 4 and a second electrical connection region 6, which is arranged on the radiation coupling-out side.

Figure 2:
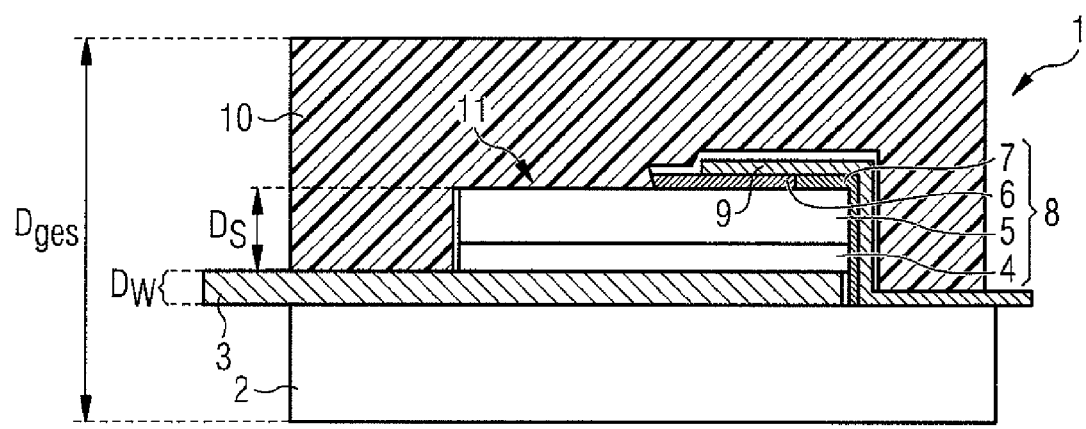
FIG. 2 shows a schematic sectional view of the first exemplary embodiment of a thin-film semiconductor component according to the invention as illustrated in FIG. 1.

As illustrated in FIG. 2, the layer stack 8 is arranged on a carrier layer 2 having a heat dissipating layer 3. In particular, the carrier layer 2 is a film on which the heat dissipating layer 3 is structured before the layer stack 8 is mounted onto the heat dissipating layer 3. Preferably, the layer stack 8 is bonded onto the heat dissipating layer 3.

The thickness $D_W$ of the heat dissipating layer 3 is preferably between 5 µm and 30 µm, wherein a metal, for example Cu, Ni or Ag, is particularly suitable as the material.

The thickness $D_S$ of the layer sequence 5 and of the first electrical connection region 4, said thickness being approximately 7 µm, can therefore be less than the thickness $D_W$ of the heat dissipating layer 3.

The small thicknesses of the carrier layer 2, of the heat dissipating layer 3 and of the layer stack 8 enable overall a thin-film semiconductor component 1 having a small structural height. A structural height $D_{ges}$ of preferably less than 100 µm can be obtained. The combination of carrier layer 2 and covering layer 10 furthermore contributes to this, these layers replacing a housing body or forming a housing for the thin-film semiconductor component 1. The small structural height of an individual thin-film semiconductor component 1 advantageously permits a plurality of thin-film semiconductor components to be stacked, whereby the luminance can be increased.

The heat dissipating layer 3, which is provided for cooling the thin-film semiconductor component 1 and also for a first electrical connection, projects, as illustrated in FIG. 1, beyond the layer stack 8 and is embodied in sheetlike fashion. In the case illustrated, the heat dissipating layer 3 completely covers a base area of the layer stack 8. However, it is also possible for the heat dissipating layer 3 to be offset with respect to the layer stack, such that the radiation emitted by the layer sequence passes directly to the carrier layer 2. The conductor track 9, provided for a second electrical connection, preferably runs in stepped fashion. In particular, the conductor track is led from the first electrical connection region 6 along a radiation coupling-out area 11 via a side area of the layer stack 8 onto the carrier layer 2.

The heat dissipating layer 3 and the conductor track 9 project with respect to the carrier layer 2 and the covering layer 10 in a lateral direction in such a way that they can be electrically connected to a voltage supply in a simple manner.

It is conceivable to apply the conductor track 9 directly to the layer stack 8 and the carrier layer 2. As an alternative, the conductor track can be arranged on the covering layer 10.

Figure 3:
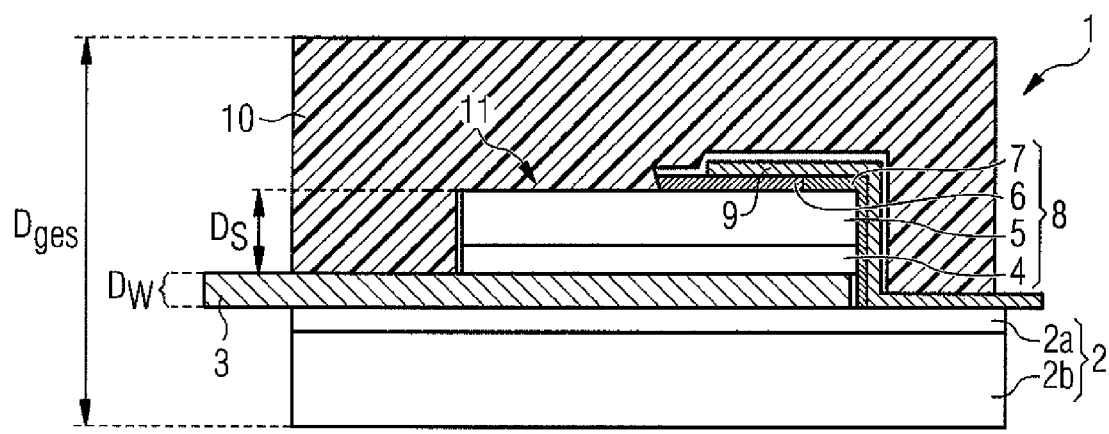
FIG. 3 shows a schematic sectional view of a second exemplary embodiment of a thin-film semiconductor component according to the invention.

In the case of the thin-film semiconductor component 1 illustrated in FIG. 3, the carrier layer 2 has a first partial layer 2a and a second partial layer 2b. The first partial layer 2a is a thin layer, wherein the thickness of the partial layer 2a is chosen in such a way that a relatively high heat flow is possible. The heat flow is antiproportional to the layer thickness.

The thickness of the partial layer 2a preferably lies in the one-digit micrometers range. In the exemplary embodiment illustrated in FIG. 3, the partial layer 2a is electrically insulating and contains a plastic material, in particular. This advantageously enables both the conductor track 9 and the heat dissipating layer 3 to be applied on the carrier layer 2, without these being short-circuited. By way of example, the heat dissipating layer 3 can be formed from a system of electrolytically deposited layers.

A film, preferably a metal film, containing copper, for example, is provided for the second partial layer 2b. A good heat transport is possible by means of the second partial layer 2b. A large expansion of the second partial layer 2b on account of heating can advantageously be counteracted by means of the first partial layer 2a, which has a lower coefficient of thermal expansion than the second partial layer 2b.

Figure 4:
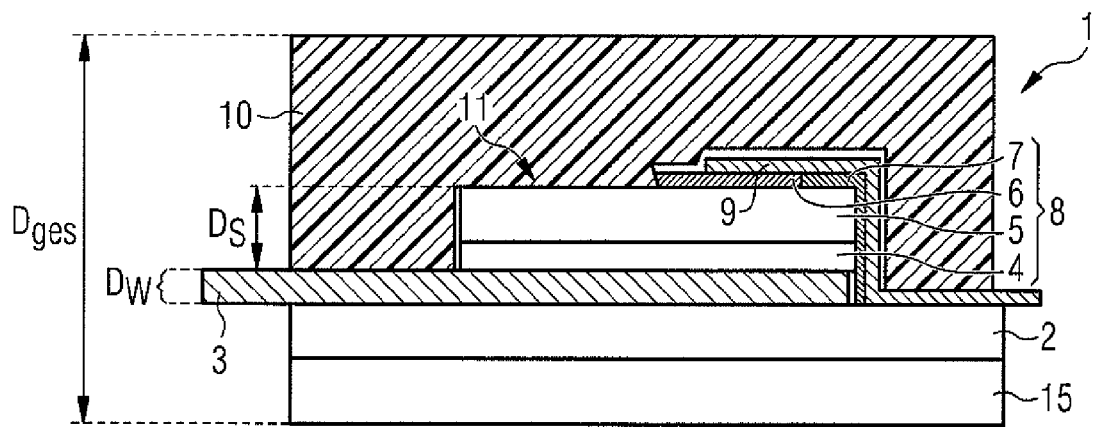
FIG. 4 shows a schematic sectional view of a third exemplary embodiment of a thin-film semiconductor component according to the invention.

In the case of the thin-film component 1 illustrated in FIG. 4, the carrier layer 2 is arranged on a support 15. The support 15 advantageously has a good thermal conductivity. In particular, the support 15 is a metal film. By contrast, the carrier layer 2 can be a plastic film. As an alternative, a carrier layer 2 composed of paper is conceivable. A thermally conductive paste, in particular, is used for mechanically and thermally connecting the carrier layer 2 to the support 15.

Figure 5:
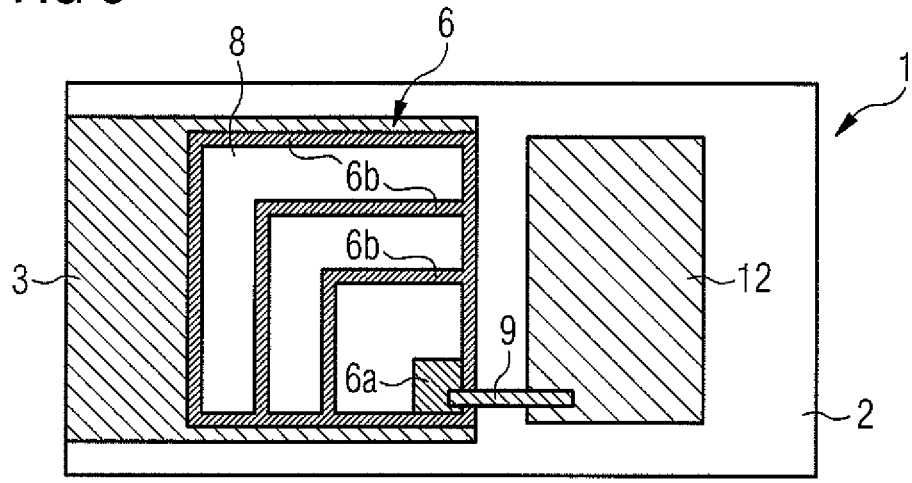
FIG. 5 shows a schematic plan view of a fourth exemplary embodiment of a thin-film semiconductor component according to the invention.

The thin-film component 1 illustrated schematically in plan view in FIG. 5 comprises a carrier layer 2 on which the heat dissipating layer 3 and the layer stack 8 are arranged. Furthermore, the carrier layer 2 has a contact pad 12, to which the conductor track 9 is electrically connected.

The second electrical connection region 6 on the coupling-out side is embodied in the form of a contact structure having a bonding pad 6a and a plurality of contact webs 6b which are provided for current spreading and which are electrically conductively connected to the bonding pad, wherein the bonding pad 6a is arranged in an edge region of the radiation exit area 11 (see FIG. 2).

The second electrical connection region 6 and the conductor track 9 expediently contain an electrically conductive material. The latter can be a metal or a TCO (transparent conductive oxide).

Figure 6:
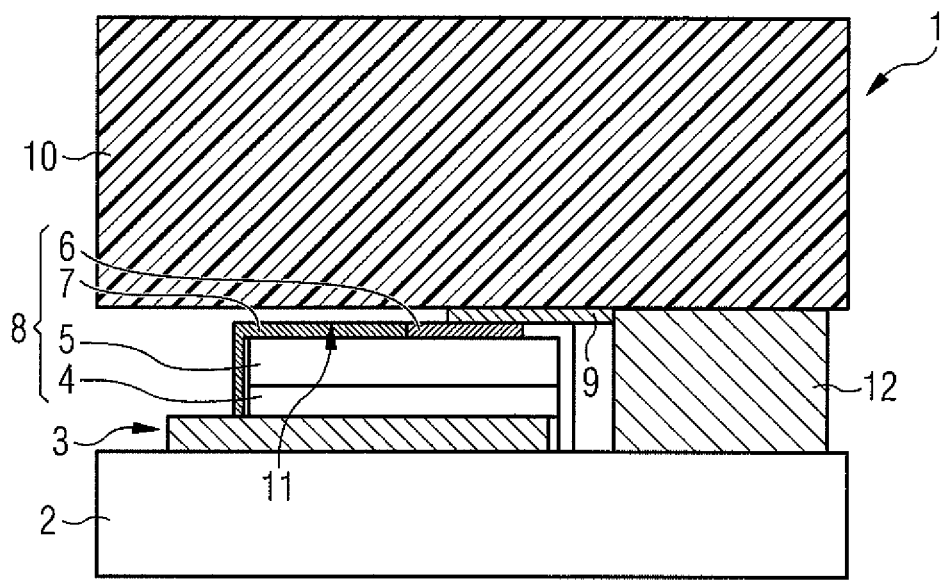
FIG. 6 shows a schematic sectional view of a fifth exemplary embodiment of a thin-film semiconductor component according to the invention.

In the case of the thin-film semiconductor component 1 illustrated in FIG. 6, electrical contact is made on the coupling-out side as in the case of the thin-film semiconductor component 1 illustrated in FIG. 5. The conductor track 9 runs substantially parallel to the radiation coupling-out area 11. Furthermore, the radiation coupling-out area 11 and a surface of the covering layer 10 that faces the radiation coupling-out area 11 are arranged substantially parallel to one another. A planar design of the thin-film semiconductor component 1 can thereby be obtained.

The layer stack 8 has at the surface an almost complete coating formed from the passivation layer 7. Furthermore, a filling layer (not illustrated) can be introduced for electrical insulation between the carrier layer 2 and the covering layer 10, said filling layer furthermore holding together the carrier layer 2 and the covering layer 10.

It is conceivable for the carrier layer 2 to be at least partly removed at the end of the production process. The carrier layer 2 can be electrically conductive, such that it is expedient to remove the carrier layer 2 in the region between the heat dissipating layer 3 and the contact pad 12, in order to avoid a short circuit during operation of the thin-film semiconductor component 1. The thin-film semiconductor component 1 can be soldered or adhesively bonded onto a printed circuit board in the case of this variant in a manner corresponding to an SMT component with the structured carrier layer 2.

The component assembly 13 illustrated in FIG. 7 has a plurality of layer stacks 8 which are preferably embodied as described in greater detail in connection with FIGS. 2 and 6. The layer stacks 8 are arranged on a common carrier layer 2. Furthermore, the layer stacks 8 are connected to a common contact pad 12 by means of the conductor tracks 9, said common contact pad being arranged on the carrier layer 2. The size of the component assembly 13 can be varied by simple division of the component assembly 13. The component assembly 13 is particularly suitable for backlighting and illumination purposes.

Figure 8A:
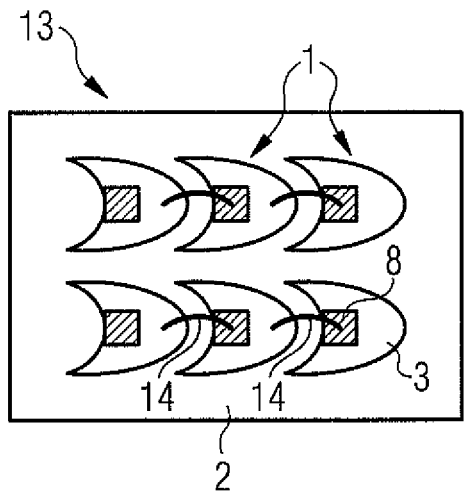
FIGS. 8a and 8b show a schematic plan view of a second and third exemplary embodiment of a component assembly according to the invention.
Figure 8B:
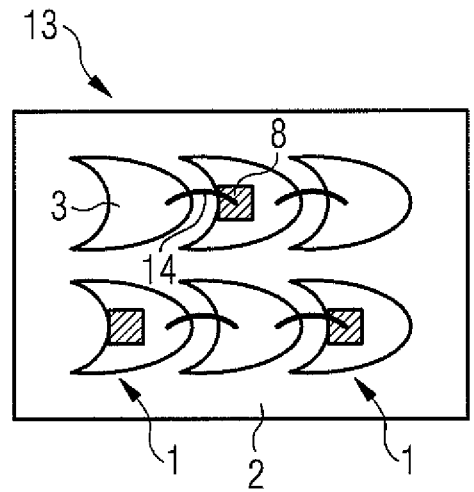

FIGS. 8a and 8b illustrate component assemblies 13 having a plurality of thin-film semiconductor components 1. The thin-film semiconductor components 1 each comprise a layer stack 8 and a part of the common carrier layer 2 on which the layer stacks 8 are arranged. Situated between the layer stacks 8 and the carrier layer 2 is a respective heat dissipating layer 3, which here serves not only for cooling but also as electrical contact. From a front side of a first thin-film semiconductor component 1, a bonding wire 14 leads to the heat dissipating layer 3—arranged on the rear side—of a second thin-film semiconductor component 1 adjacent to the first thin-film semiconductor component 1. The two thin-film semiconductor components 1 are thereby connected in series. The number of thin-film semiconductor components 1 connected in series can be chosen to be as large as desired in a manner governed by the application.

The layer stacks 8 are arranged in a decentralized manner on the respective heat dissipating layer 3, whereby improved front-side contact can be made with the layer stacks 8 in comparison with a central arrangement.

The base area of the heat dissipating layer 3 is embodied in scale-like fashion and has, in particular, an indented side edge and a bulgy side edge opposite the latter. The layer stack 8 is preferably arranged at the indented side edge since the impression of current is better here than at the bulgy side edge.

As illustrated in FIG. 8b, some of the heat dissipating layers 3 can be free of layer stacks 8. Nevertheless, the unpopulated heat dissipating layers 3 are preferably incorporated into the series circuit, such that a layer stack 8 surrounded by unpopulated heat dissipating layers 3 can advantageously also be supplied electrically in a comparatively simple manner. Luminous patterns of different types can advantageously be generated by changing populated and unpopulated heat dissipating layers 3.

Figure 8C:
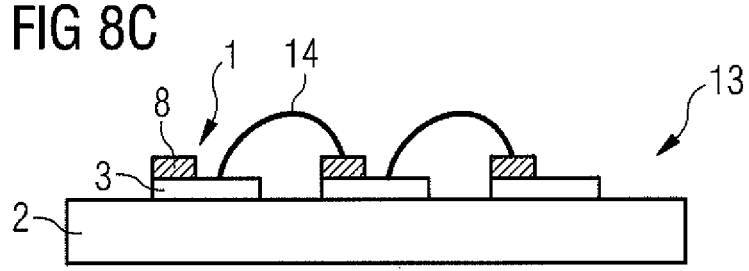
FIG. 8c shows a schematic cross-sectional view of the second exemplary embodiment illustrated in FIG. 8a, FIG. 9 shows a schematic cross-sectional view of a fourth exemplary embodiment of a component assembly according to the invention.

FIG. 8c shows a cross-sectional view of the component assembly 13 already described in connection with FIG. 8a.

Figure 9:
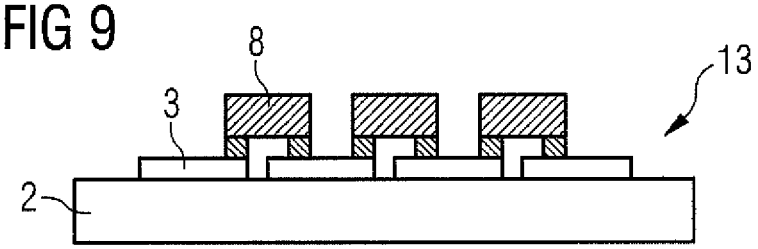

In the case of the exemplary embodiment illustrated in FIG. 9, the component assembly 13 comprises a plurality of layer stacks 8 which are arranged on a common carrier layer 2 and are in each case mechanically and electrically connected to a first heat dissipating layer 3 and a second heat dissipating layer 3 adjacent to the first heat dissipating layer 3. In this case, both electrical contacts are situated on that side of the layer stack 8 which faces the respective heat dissipating layers 3. Consequently, two adjacent heat dissipating layers 3 are in each case bridged by a layer stack 8. At the same time, the layer stacks 8 can be connected in a series circuit by an uninterrupted bridging of adjacent heat dissipating layers 3 by means of a plurality of layer stacks 8.

Figure 10:
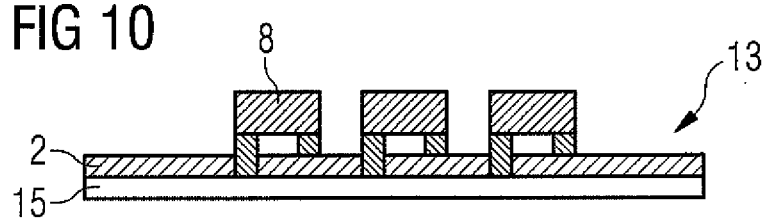
FIG. 10 shows a schematic cross-sectional view of a fifth exemplary embodiment of a component assembly according to the invention.

In the case of the exemplary embodiment of a component assembly 13 as illustrated in FIG. 10, too, both electrical contacts of the layer stacks 8 are arranged on the side facing the carrier layer 2. In this case, the carrier layer 2 contains an electrically insulating material, in particular a plastic material, and furthermore has openings for plated-through holes. The carrier layer 2 is preferably a plastic film. The support 15, to which the carrier layer 2 is mechanically and thermally connected, is preferably a metal film, such that a first electrical connection of the layer stacks 8 is effected by means of the support 15. A second electrical connection of the layer stacks is possible by means of the heat dissipating layer (not illustrated) applied on the carrier layer 2.

Advantageously, the methods for wire-free contact-making used in the context of the invention do not require an aligned bonding process. Furthermore, the arrangement of the heat dissipating layer, serving as conductor track, and of the further conductor track on one side of the component enables contact to be made with the thin-film semiconductor component in a simple manner.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A thin-film semiconductor component comprising:
a carrier layer, wherein the carrier layer is a film;
a layer stack arranged on the carrier layer, the layer stack containing a semiconductor material and configured to emit radiation; and
a heat dissipating layer configured to cool the thin-film semiconductor component and applied on the carrier layer, the heat dissipating layer being arranged between the carrier layer and the layer stack,
wherein the thin-film semiconductor component is free of a growth substrate used for growing the layer stack,
wherein the heat-dissipating layer is embodied as a closed area,
wherein side edges bounding the closed area run in curved fashion,
wherein the heat-dissipating layer comprises an indented side edge and a bulgy side edge opposite to the indented side edge, and
wherein the layer stack is arranged at the indented side edge.

2. The thin-film semiconductor component as claimed in claim 1, wherein the heat dissipating layer has a base area which is at least equal in size to a base area of the layer stack.

3. The thin-film semiconductor component as claimed in claim 1, wherein the heat dissipating layer has a thickness of about one- to two-digit micrometers.

4. The thin-film semiconductor component as claimed in claim 1, wherein the carrier layer contains a plastic material.

5. The thin-film semiconductor component as claimed in claim 1, wherein the carrier layer comprises a first partial layer and a second partial layer, and wherein the first partial layer is a layer applied to the second partial layer and the second partial layer is a film.

6. The thin-film semiconductor component as claimed in claim 1, wherein the carrier layer has a thickness of less than or equal to 100 µm.

7. The thin-film semiconductor component as claimed in claim 6, wherein the thin-film semiconductor component has a thickness of less than or equal to 100 µm.

8. The thin-film semiconductor component as claimed in claim 1, wherein a covering layer configured to cover the layer stack is arranged on a side of the layer stack opposite to the carrier layer.

9. The thin-film semiconductor component as claimed in claim 8, wherein the covering layer is a film.

10. The thin-film semiconductor component as claimed in claim 8, wherein the covering layer contains a transparent material.

11. The thin-film semiconductor component as claimed in claim 8, wherein the covering layer has an optical structure.

12. The thin-film semiconductor component as claimed in claim 11, wherein the covering layer is partly reflectively coated.

13. A component assembly comprising at least two thin-film semiconductor components as claimed in claim 1, wherein the thin-film semiconductor components have a common carrier layer.

14. The component assembly as claimed in claim 13, wherein a common contact pad for an electrical contact of the layer stacks on a coupling-out side is applied on the carrier layer between the layer stacks.

15. The component assembly as claimed in claim 13, wherein the thin-film semiconductor components are connected in series.

16. The thin-film semiconductor component as claimed in claim 1, wherein the heat dissipating layer is arranged directly on the carrier layer.

17. The thin-film semiconductor component as claimed in claim 16, wherein at least part of the layer stack is arranged directly on the heat dissipating layer.

* * * * *